United States Patent
Doherty et al.

(10) Patent No.: US 6,337,577 B1
(45) Date of Patent: *Jan. 8, 2002

(54) INTERCONNECT AND SYSTEM FOR TESTING BUMPED SEMICONDUCTOR COMPONENTS WITH ON-BOARD MULTIPLEX CIRCUITRY FOR EXPANDING TESTER RESOURCES

(75) Inventors: C. Patrick Doherty; Jorge L. deVarona; Salman Akram, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/244,373

(22) Filed: Feb. 4, 1999

Related U.S. Application Data

(63) Continuation-in-part of application No. 09/075,691, filed on May 11, 1998, now Pat. No. 6,246,250.

(51) Int. Cl.[7] ............................................. G01R 31/26
(52) U.S. Cl. ........................ 324/765; 324/754; 324/755
(58) Field of Search .................................. 324/754, 755, 324/756, 757, 758, 765, 158.1

(56) References Cited

U.S. PATENT DOCUMENTS

| | | | |
|---|---|---|---|
| 3,806,801 A | 4/1974 | Bove | 324/72.5 |
| 4,027,935 A | 6/1977 | Byrnes et al. | 339/48 |
| 4,585,991 A | 4/1986 | Reid et al. | 324/158 P |
| 4,891,585 A | 1/1990 | Janko et al. | 324/158 P |
| 4,906,920 A | 3/1990 | Huff et al. | 324/158 P |
| 4,918,383 A | 4/1990 | Huff et al. | 324/158 F |
| 4,954,458 A | 9/1990 | Reid | 437/51 |
| 5,042,148 A | 8/1991 | Tada et al. | 29/852 |
| 5,053,700 A | 10/1991 | Parrish | |
| 5,055,780 A | 10/1991 | Takagi et al. | |
| 5,070,297 A | 12/1991 | Kwon et al. | |
| 5,103,557 A | 4/1992 | Leedy | |
| 5,124,639 A | 6/1992 | Carlin et al. | 324/158 P |
| 5,172,050 A | 12/1992 | Swapp | 324/158 P |
| 5,177,439 A | 1/1993 | Liu et al. | 324/158 P |
| 5,180,977 A | 1/1993 | Huff | 324/158 P |
| 5,196,726 A | 3/1993 | Nishiguichi et al. | 257/737 |
| 5,225,037 A | 7/1993 | Elder et al. | 156/644 |
| 5,264,787 A | 11/1993 | Woith et al. | 324/158 P |
| 5,323,107 A | 6/1994 | D'Souza | |

(List continued on next page.)

OTHER PUBLICATIONS

U.S. application No. 09/075,691, Doherty et al.

*Primary Examiner*—Safet Metjahic
*Assistant Examiner*—Jimmy Nguyen
(74) *Attorney, Agent, or Firm*—Stephen A. Gratton

(57) ABSTRACT

An interconnect, a test system, and a test method for testing bumped semiconductor components, such as dice and packages, contained on substrates, such as wafers or panels, are provided. The test system includes the interconnect, a tester for generating test signals, and a wafer prober for placing the components and interconnect in physical contact. The interconnect includes interconnect contacts, such as conductive pockets, for electrically engaging bumped component contacts on the components. The interconnect also includes an on board multiplex circuit adapted to fan out and selectively transmit test signals from the tester to the interconnect contacts. The multiplex circuit expands tester resources by allowing test signals to be written to multiple components in parallel. Reading of the test signals from the components can be performed in groups up to the limit of the tester resources. In addition to expanding tester resources, the multiplex circuit maintains the individuality of each component, and permits defective components to be electrically disconnected.

20 Claims, 7 Drawing Sheets

U.S. PATENT DOCUMENTS

| | | | |
|---|---|---|---|
| 5,329,423 A | | 7/1994 | Scholz ........................ 361/760 |
| 5,475,317 A | * | 12/1995 | Smith ......................... 324/760 |
| 5,477,160 A | * | 12/1995 | Love .......................... 324/755 |
| 5,483,741 A | | 1/1996 | Akram et al. .................. 29/846 |
| 5,491,427 A | * | 2/1996 | Ueno et al. ................. 324/754 |
| 5,500,605 A | | 3/1996 | Chang ......................... 324/758 |
| 5,592,736 A | | 1/1997 | Akram et al. .................. 29/842 |
| 5,625,298 A | | 4/1997 | Hirano et al. ................. 324/754 |
| 5,686,317 A | * | 11/1997 | Akram et al. ................... 437/8 |
| 5,736,850 A | * | 4/1998 | Legal ...................... 324/158.1 |
| 5,789,271 A | * | 8/1998 | Akram ........................ 438/18 |
| 5,834,954 A | * | 10/1998 | Akram et al. ................ 324/755 |
| 5,834,945 A | * | 11/1998 | Akram et al. ................ 324/755 |
| 5,869,974 A | | 2/1999 | Akram et al. |
| 5,915,977 A | * | 6/1999 | Hembree et al. ............. 439/74 |
| 5,962,921 A | | 10/1999 | Farnworth et al. |
| 6,016,060 A | | 1/2000 | Akram et al. |
| 6,040,702 A | | 3/2000 | Hembree et al. |
| 6,060,891 A | | 5/2000 | Hembree et al. |
| 6,072,321 A | | 6/2000 | Akram et al. |
| 6,078,186 A | * | 6/2000 | Hembree et al. ........... 324/755 |
| 6,091,252 A | | 7/2000 | Akram et al. |
| 6,107,109 A | | 8/2000 | Akram et al. |
| 6,127,736 A | | 10/2000 | Akram |
| 6,181,144 B1 | | 1/2001 | Hembree et al. |
| 6,188,232 B1 | | 2/2001 | Akram et al. |
| 6,204,678 B1 | | 3/2001 | Akram et al. |
| 6,208,157 B1 | | 3/2001 | Akram et al. |
| 6,218,848 B1 | | 4/2001 | Hembree et al. |
| 6,229,324 B1 | | 5/2001 | Akram et al. |
| 6,232,243 B1 | | 5/2001 | Farnworth et al. |

* cited by examiner

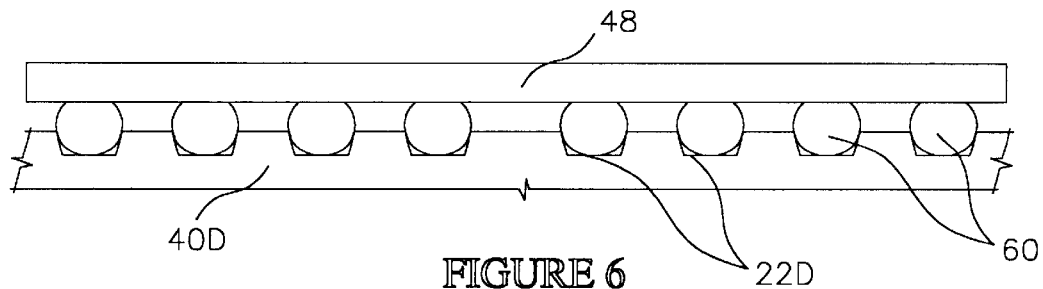

FIGURE 6

PLACE CONTACTS 22 ON INTERCONNECT 20
IN ELECTRICAL COMMUNICATION
WITH BUMPED COMPONENT CONTACTS 12
ON COMPONENTS 11 (DEVICES UNDER TEST).

TEST THE COMPONENTS 11 IN GROUPS FOR
OPENS AND SHORTS BY SELECTIVELY
ACTUATING CONTACTS 22 ON
THE INTERCONNECT 20 UP TO LIMIT
OF TESTER RESOURCES.

DISABLE DEFECTIVE COMPONENTS 11 BY
SELECTIVELY ACTUATING CONTACTS 22
ON THE INTERCONNECT 20.

WRITE TEST SIGNALS FROM TESTER 26 TO
MULTIPLE COMPONENTS 11 BY
MULTIPLEXING INPUT TEST SIGNALS TO
SELECTED CONTACTS 22 AND BUMPED
COMPONENT CONTACTS 12 ON MULTIPLE
COMPONENTS 11 AT THE SAME TIME.

READ TEST SIGNALS FROM MULTIPLE
COMPONENTS 11 IN GROUPS UP TO LIMIT OF
TESTER RESOURCES, WHILE MAINTAINING
COMPONENT UNIQUENESS AND ABILITY TO
DISCONNECT DEFECTIVE COMPONENTS 11.

FIGURE 7

INTERCONNECT AND SYSTEM FOR TESTING BUMPED SEMICONDUCTOR COMPONENTS WITH ON-BOARD MULTIPLEX CIRCUITRY FOR EXPANDING TESTER RESOURCES

CROSS REFERENCE TO RELATED APPLICATIONS

This application is a continuation-in-part of U.S. patent application Ser. No. 09/075,691, U.S. Pat. No. 6,246,250, filed May 11, 1998.

FIELD OF THE INVENTION

This invention relates generally to semiconductor manufacture and specifically to a probe card for testing semiconductor wafers. This invention also relates to test systems and test methods employing the probe card.

BACKGROUND OF THE INVENTION

Semiconductor wafers are tested prior to singulation into individual die, to assess the electrical characteristics of the integrated circuits contained on each die. A typical wafer-level test system includes a wafer prober for handling and positioning the wafers, a tester for generating test signals, a probe card for making temporary electrical connections with the wafer, and a prober interface board to route signals from the tester pin electronics to the probe card.

The test signals can include specific combinations of voltages and currents transmitted through the pin electronics channels of the tester to the probe interface board, to the probe card, and then to one or more devices under test on the wafer. During the test procedure response signals such as voltage, current and frequency can be analyzed and compared by the tester to required values. The integrated circuits that do not meet specification can be marked or mapped in software. Following testing, defective circuits can be repaired by actuating fuses to inactivate the defective circuitry and substitute redundant circuitry.

Different types of probe cards have been developed for probe testing semiconductor wafers. The most common type of probe card includes elongated needle probes configured to electrically engage die contacts, such as bond pads, or other contacts on the wafer. An exemplary probe card having needle probes is described in U.S. Pat. No. 4,563,640 to Hasegawa et al.

Although widely used, needle probe cards are difficult to maintain and unsuitable for high parallelism applications, in which multiple dice must be tested at the same time. In addition, needle probe cards are not suitable for some applications in which the dice have high count die contact requirements, such as bond pads in dense grid arrays. In particular, the long needles and variations in the needles lengths makes it difficult to apply a constant gram force to each die contact. Long needles can also generate parasitic signals at high speeds (e.g., >500 MHZ).

A similar type of probe card includes buckle beams adapted to flex upon contact with the wafer. This type of probe card is described in U.S. Pat. No. 4,027,935 to Byrnes et al. Although better for high count die contacts, and high parallelism applications, buckle beam probe cards are expensive, and difficult to maintain.

Another type of probe card, referred to as a "membrane probe card", includes a membrane formed of a thin and flexible dielectric material such as polyimide. An exemplary membrane probe card is described in U.S. Pat. No. 4,918,383 to Huff et al. With membrane probe cards, contact bumps are formed on the membrane in electrical communication with conductive traces, typically formed of copper.

One disadvantage of membrane contact bumps is that large vertical "overdrive" forces are required to penetrate oxide layers and make a reliable electrical connection with the die contacts on the dice. These forces can damage the die contacts and the dice. In addition, membrane probe cards can be repeatedly stressed by the forces, causing the membrane to lose its resiliency. Use of high probe temperatures can also cause the membrane to lose resiliency.

Another disadvantage of membrane probe cards is the CTE (coefficient of thermal expansion) mismatch between the membrane probe card and wafer. In the future, with decreasing size of each die contact, higher parallelism requirements, and increased probing temperatures, maintaining electrical contact with the die contacts will be increasingly more difficult. In addition, because of relatively large differences between the CTE of membrane probe cards and silicon wafers, maintaining electrical contact between a large number of dice and a membrane probe card will be almost impossible.

Yet another limitation of conventional test systems, and a disadvantage of conventional probe cards, is that full functionality testing must be performed at the die level rather than at the wafer level. These tests require a large number of connections with the dice, and separate input/output paths between the dice and test circuitry. For functional test procedures on dice having multiple inputs and outputs, an input/output path must be provided to several die contacts at the same time. The number of dice that can be tested in parallel is always limited by the number of drive only, and input/output channels the tester provides, as well as the die contact arrangements on the dice. The number of drive only and input/output channels is fixed for a particular test system by its manufacturer.

To maintain speed characteristics for high count die contacts, the die contacts must be distributed throughout, or around the edges of the dice in a dense array. With this arrangement it is very difficult to parallel probe multiple dice using needle type probe cards, and impossible with dice having high count die contacts. Buckle beam probe cards are a costly alternative for probing dice having high count die contacts.

In view of the foregoing, improved probe cards capable of testing wafers with large numbers of dice, and high count die contacts, at high speeds, are needed in the art. In addition, probe cards capable of expanding tester resources to accommodate high parallelism, and high count die contact testing applications are needed in the art.

SUMMARY OF THE INVENTION

In accordance with the present invention, a probe card, a test system, and a test method for testing semiconductor dice contained on a wafer are provided. The probe card is adapted for use with a conventional tester and wafer prober. The probe card includes an on board multiplex circuit adapted to fan out, and selectively transmit, test signals from the tester to the wafer in response to control signals. The multiplex circuit includes active electrical switching devices, such as FETs, operable by control signals generated by a controller.

The multiplex circuit allows tester resources to be fanned out to multiple devices under test, while maintaining the uniqueness of each device, and the ability to disconnect failing devices. The additional control of the test signals also speeds up the testing process, and allows higher wafer throughputs using the same tester resources.

In addition to the multiplex circuit, the probe card includes a substrate, and a pattern of contacts formed on the substrate. During a test procedure, the probe card contacts make temporary electrical connections with die contacts on the wafer. Each probe card contact can be enabled or disabled as required by the multiplex circuit, to selectively write (send) the test signals to the die contacts, and to selectively read (receive) output signals from the die contacts.

The probe card and its contacts can be configured to electrically engage one die at a time, or multiple dice at the same time, up to all of the dice contained on the wafer. In an exemplary test procedure, dice can be tested for opens and shorts in groups corresponding to the available tester resources. Next, multiple dice can be written to in parallel by multiplexing drive only and I/O resources of the tester. Following the write step, multiple dice can be read in parallel in groups corresponding to the available tester drive only and I/O resources.

With the probe card comprising a semiconducting material such as silicon, the multiplex circuit can include integrated circuits and active electrical switching devices, formed directly on the substrate, using semiconductor circuit fabrication techniques. Alternately, the multiplex circuit can be fabricated on an interposer mounted to the probe card substrate, or on a die attached to the probe card substrate.

BRIEF DESCRIPTION OF THE DRAWINGS

FIG. 6 is an enlarged view of a portion of FIG. 3 illustrating the probe card;

FIG. 7 is a block diagram illustrating steps in a method for testing in accordance with the invention;

DETAILED DESCRIPTION OF THE PREFERRED EMBODIMENTS

Figure 1A:
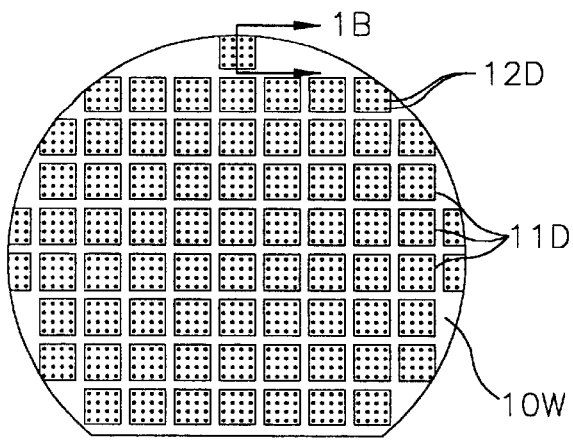
FIG. 1 is a plan view of a prior art semiconductor wafer containing multiple semiconductor dice.
Figure 1B:
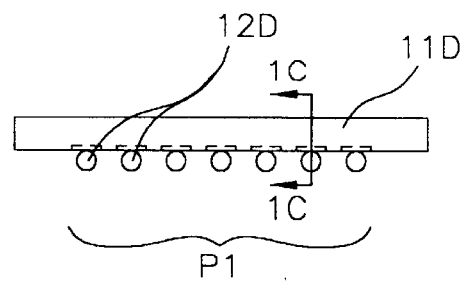
Figure 1C:
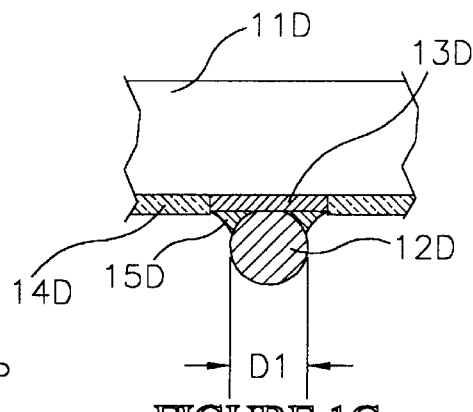
Figure 2A:
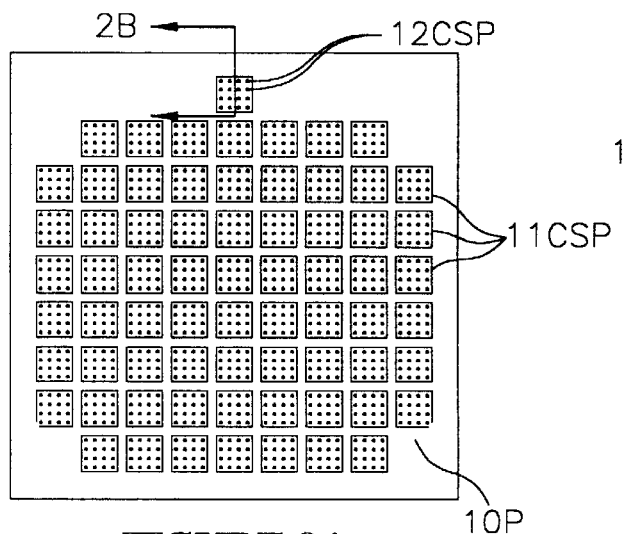
FIG. 2 is a plan view of a prior art semiconductor die illustrating die contacts on a face of the die and exemplary functional designations for the die contacts.
Figure 2B:
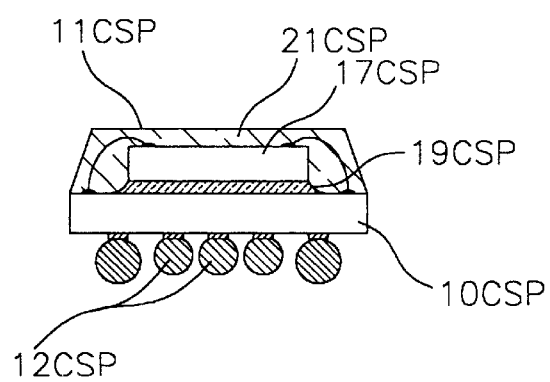

Referring to FIG. 1, a prior art semiconductor wafer 10 includes multiple semiconductor dice 12 fabricated using processes that are well known in the art. As shown in FIG. 2, each die 12 includes multiple die contacts 14 formed thereon. The die contacts 14 comprise metal pads in electrical communication with integrated circuits contained on the die 12.

Following singulation of the wafer 10, the dice 12 can be packaged. In this case, the die contacts 14 can be wire bonded to lead fingers formed on a leadframe. The singulated dice 12 can also be used in unpackaged form as known good die (KGD). In this case, the die contacts 14 can be wire bonded to a substrate, such as a printed circuit board, or alternately flip chip mounted using reflowed solder bumps. The singulated dice 12 can also be included in chip scale packages. In this case, interconnects such as conductive bumps electrically contact the die contacts 14 to establish electrical communication with external contacts on a substrate.

For illustrative purposes, each die 12 includes twenty eight die contacts 14 with the functional designations indicated in FIG. 2. However, as is apparent, the number and functional arrangements of the die contacts 14 are merely exemplary, and other arrangements are possible.

Figure 3:
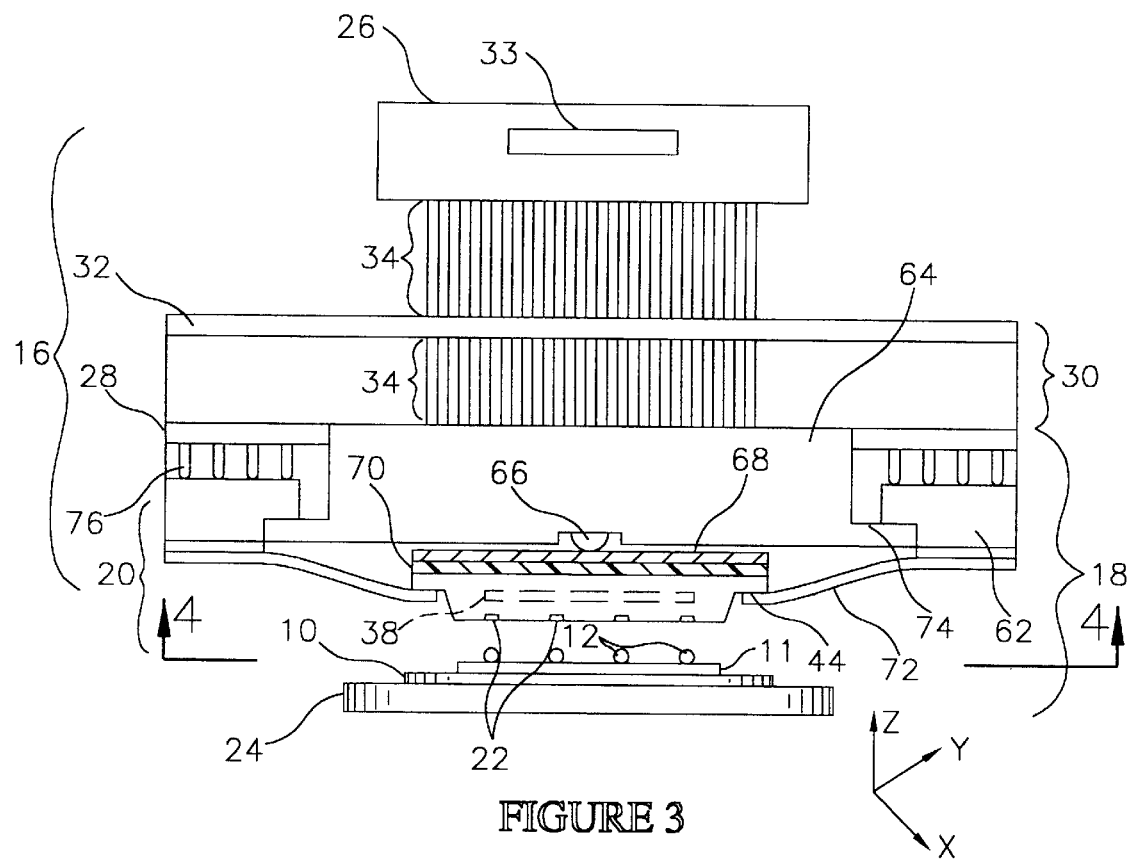
FIG. 3 is a schematic cross sectional view of a test system constructed in accordance with the invention.

Referring to FIG. 3, a test system 16 constructed in accordance with the invention, and configured to test the dice 12 contained on the wafer 10. The test system 16 includes a test head 30 and a probe card 20. The probe card 20 includes probe card contacts 22 configured to make temporary electrical connections with the die contacts 14. The test system 16 also includes a wafer prober 18 wherein the probe card 20 is mounted, and a tester 26 configured to apply test signals through the probe card 20, to the dice 12 contained on the wafer 10, and to analyze the resultant signals. The wafer prober 18 includes a probe card holder 62 for mounting and electrically interfacing with the probe card 20. Further details of the mounting of the probe card 20 to the test head 30 will be hereinafter described.

The wafer prober 18 includes a wafer chuck 24 configured to move in X and Y directions to align the wafer 10 with the probe card 20, and in the Z direction to move the wafer 10 into contact with the probe card 20. One suitable wafer prober 18 is manufactured by Electroglass and is designated a Model 4080.

The test system 16 also includes a prober interface board 28 for routing test signals from the test head 30 to the probe card 20. In addition, the prober interface board 28 can be in electrical communication with tester pin electronics 32 in the test head 30. The tester pin electronics 32 provide separate electrical paths 34 from test circuitry 33 contained in the tester 26, to the test head 30 and to the prober interface board 28.

The signal generating and analyzing capability of the test circuitry 33, and the number of separate electrical paths 34 provided by the tester pin electronics 32, are termed herein as "tester resources". In general, the configurations of the test circuitry 33, and of the electrical paths 34, are fixed for a particular tester 26 by the manufacturer. For example, the test circuitry 33 can be configured to route drive only signals through some of the electrical paths 34, and input/output channels through other of the electrical paths 34, as required for testing a particular type of die 12. Exemplary testers 26 are commercially available from Teradyne of Boston MA, as well as other manufacturers.

Figure 4:
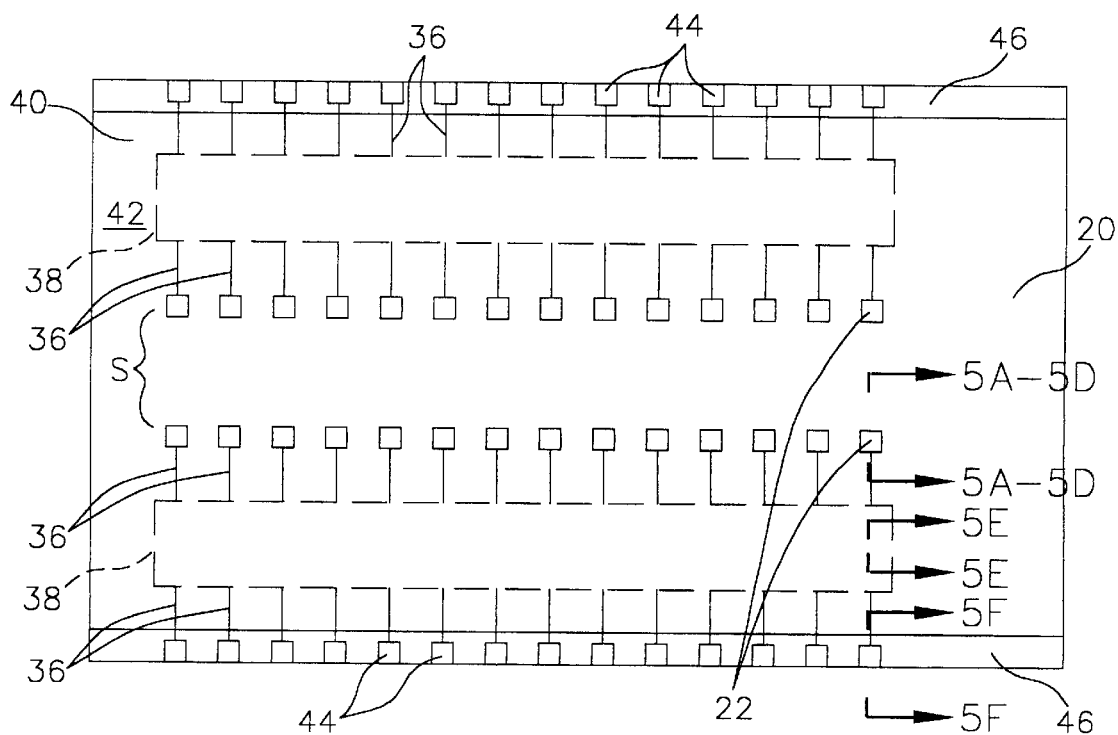
FIG. 4 is an enlarged plan view taken along section line 4—4 of FIG. 3 illustrating a probe card constructed in accordance with the invention.

Referring to FIG. 4, further details of the probe card 20 are illustrated. The contacts 22 on the probe card 20 are arranged in patterns corresponding to the patterns of the die contacts 14. Each pattern of contacts 22 represents a single test site (S). For simplicity, only one pattern of contacts 22 and one test site (S) on the probe card 20 is illustrated. However, in actual practice, the probe card 20 can include multiple patterns of contacts 22 forming multiple test sites (S1 . . . Sn) to accommodate testing of multiple dice 12 at the same time. The contacts 22 on the test site S are designated 1–28 in correspondence with the die contacts 14 (FIG. 2).

In order to test multiple dice 12 at the same time certain conditions must be met. Firstly, the patterns of contacts 22 must exactly match the patterns of the die contacts 14. In addition, the stepping distance (i.e., x-y repeat and pattern spacing) must be the same for the contacts 22 as for the die contacts 14. Secondly, the software that controls the stepping process must be able to pick valid test sites. For example, when testing at the edges of a round wafer with a probe card that includes rectangular or square patterns of contacts 22, some patterns of contacts 22 will not have an associated device under test. It is also desirable to not have contacts 22 contacting a passivation layer 48 (FIG. 5A) on the dice 12 as this can damage the contacts 22.

In general, the use of the probe card 20 can greatly reduce the number of steps necessary for the prober 18 to test all of the dice 12 contained on the wafer 10. In the extreme case, rather than using stepping methods, the probe card 20 can be formed with enough patterns of contacts 22 to simultaneously contact every die contact 14 for all of the dice 12 on the wafer 10. Test signals can then be selectively applied and electronically switched as required, to selected dice 12 on the wafer 10. The probe card 20 can be formed with any desired number of test sites (S1 . . . Sn). In addition, the probe card 20 can be configured to test a complete semiconductor wafer 10, or to test a portion of the dice 12 in a partial wafer, or other substrate.

Still referring to FIG. 4, in addition to the patterns of contacts 22, the probe card 20 includes patterns of conductors 36 in electrical communication with the contacts 22 and with on-board circuitry 38. The contacts 22 and conductors 36 are formed on a substrate 40 of the probe card 20.

Figure 5A:
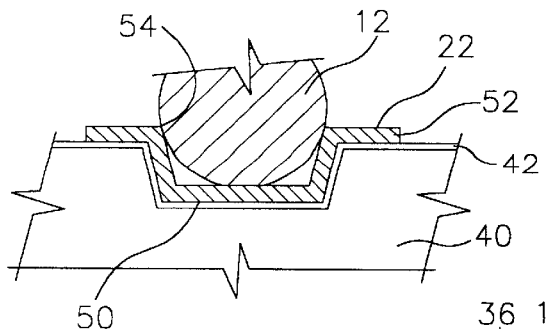
FIG. 5A is an enlarged cross sectional view taken along section line 5A—5A of FIG. 4, following contact of the probe card and wafer, and illustrating probe card contacts electrically engaging die contacts on the wafer.

In the embodiment illustrated in FIG. 5A, the substrate 40 comprises silicon (or another semiconducting material such as gallium arsenide). This permits the on-board circuitry 38 to be formed as integrated circuits on the substrate 40 using semiconductor circuit fabrication techniques such as doping, CVD, photolithography, and etching. Also, with the substrate 40 comprising silicon, a coefficient of thermal expansion of the probe card 20 exactly matches that of the wafer 10. The substrate 40 can also comprise a silicon containing material, such as silicon-on-glass, and the on board circuitry can be formed on a layer of the substrate 40.

Preferably, the substrate 40 is thick enough to resist deflection and buckling during test procedures using the probe card 20. In addition, an electrically insulating layer 42, such as $SiO_2$, polyimide, or BPSG can be formed on the substrate 40 to provide insulation for the contacts 22 and conductors 36 from the bulk of the substrate 40.

The conductors 36 on the substrate 40 are in electrical communication with the probe card contacts 22, and with the on board circuitry 38. The conductors 36 can be formed on a surface of the substrate 40 in a required pattern. In addition, the conductors 36 can include interlevel segments, such as metal vias or other interlevel electrical paths, that are in electrical communication with other components of the on-board circuitry 38.

In addition, the conductors 36 can be placed in electrical communication with the test circuitry 33 to provide electrical paths from the test circuitry 33 (FIG. 3) to the on-board circuitry 38, and to the contacts 22. Preferably, the conductors 36 comprise a highly conductive metal such as copper, aluminum, titanium, tantalum, tungsten, molybdenum or alloys of these metals. The conductors 36 can be formed as a single layer of metal, or as a multi metal stack, using a thin film metallization process (e.g., CVD, patterning, etching). Alternately, a thick film metallization process (e.g., screen printing, stenciling) can be used to form the conductors 36.

Figure 5E:
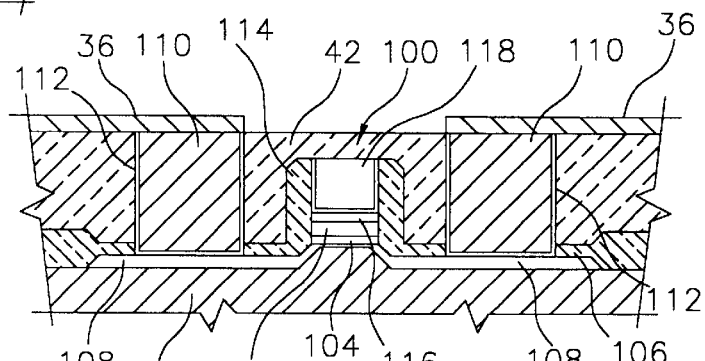
FIG. 5E is an enlarged cross sectional view taken along section line 5E—5E of FIG. 4A illustrating an alternate embodiment probe card contact electrically engaging a bumped die contact on the wafer.

The conductors 36 also include bonding pads 44 located along the peripheral edges of the probe card 20. The bonding pads 44 provide bonding sites for forming separate electrical paths from the probe card holder 62 (FIG. 1) to each of the conductors 36. Preferably the bonding pads 44 are located on recessed surfaces 46 (FIG. 5C) along the edges of the substrate 40 to provide clearance for TAB bonds, wire bonds, spring loaded connectors (e.g., "POGO PINS") or other electrical connections to the bonding pads 44.

Referring to FIG. 5A, the probe card contacts 22 are shown in an enlarged cross sectional view. In the embodiment of FIG. 5A, the contacts 22 comprise raised members that project from a surface of the substrate 40. The raised contacts 22 help to provide a separation distance between the probe card 20 and the wafer 10 to clear any particulate contaminants that may be present on the opposing surfaces. In addition, the contacts 22 can include penetrating projections 50 adapted to penetrate the die contacts 14 to a limited penetration depth. To limit the penetration depth, the penetrating projections 50 have a height that is less than a thickness of the die contacts 14. For thin film aluminum die contacts 14, this thickness will typically be less than about 1.0 $\mu$m. As also shown in FIG. 5A, surfaces 52 at the tips of the contacts 22 provide stop planes for limiting penetration of the contacts 22 into the die contacts 14. These stop plane surfaces 52 along with the dimensions of the penetrating projections 50 insures that the contacts 22 minimally damage the die contacts 14 during a test procedure.

The contacts 22 and penetrating projections 50 can be formed integrally with the substrate 40 using a bulk micromachining process. With such a process, an etch mask (e.g., $Si_3N_4$ layer) can be formed on the substrate 40 and a suitable etchant, such as KOH, can be used to etch the substrate 40 to form the contacts 22. Solid areas of the etch mask determine the peripheral dimensions and shape of the contacts 22. The etch rate and time of the etch process determine the etch depth and the height of the contacts 22. Such a process permits the contacts 22, and penetrating projections 50, to be formed accurately, and in a dense array to accommodate testing of dense arrays of die contacts 14.

A representative height of the contacts 22 can be from 50 $\mu$m to 100 $\mu$m. A representative width of the contacts 22 on a side can be from 25 $\mu$m to 80 $\mu$m. A spacing of the contacts 22 matches the spacing of the die contacts 14. A height of the penetrating projections 50 can be from about 2000 Å–5000 Å.

Still referring to FIG. 5A, each contact 22 is covered with a conductive layer 54 in electrical communication with a conductor 36. The conductive layers 54 for all of the contacts 22 can be formed of a metal layer deposited and patterned to cover the contacts 22, or other selected areas of the substrate 40. By way of example, the conductive layers 54 for the contacts 22 can comprise aluminum, copper, titanium, tungsten, tantalum, platinum, molybdenum, cobalt, nickel, gold, iridium or alloys of these metals. Some of these materials such as gold and platinum are non-reactive so that material transfer between the contacts 22 and the die contacts 14 can be minimized. The conductive layers 54 can also comprise a metal silicide or a conductive material such as doped polysilicon. Further, the conductive layers 54 can comprise a bi-metal stack including a base layer, and a non-reactive and oxidation resistant outer layer, such as gold or platinum.

The conductive layers 54 can be formed using a metallization process that includes blanket deposition (e.g., CVD), formation of a resist mask, and then etching. Preferably, the resist mask comprises a thick film resist that can be deposited to a thickness greater than a conventional resist. One suitable resist is a negative tone, thick film resist sold by Shell Chemical under the trademark "EPON RESIN SU-8".

The conductive layer 54 for each contact 22 is in electrical communication with a corresponding conductor 36 formed on the substrate 40. The conductive layers 54 and conductors 36 can be formed at the same time using the same metallization process. Alternately, the conductors 36 can be formed of a different metal than the conductive layers 54 using separate metallization process.

A process for fabricating the contacts 22 on a silicon substrate, substantially as shown in FIG. 5A is described in U.S. Pat. No. 5,483,741, entitled "METHOD FOR FABRICATING A SELF LIMITING SILICON BASED INTERCONNECT FOR TESTING BARE SEMICONDUCTOR DICE", and in U.S. Pat. No. 5,686,317 entitled "METHOD FOR FORMING AN INTERCONNECT HAVING A PENETRATION LIMITED CONTACT STRUCTURE FOR ESTABLISHING A TEMPORARY ELECTRICAL CONNECTION WITH A SEMICONDUCTOR DIE", both of which are incorporated herein by reference.

Figure 5B:
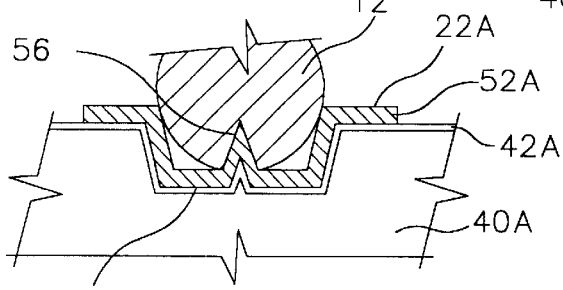
FIG. 5B is an enlarged cross sectional view taken along section line 5B—5B of FIG. 4, illustrating a FET transistor of on board circuitry contained on the probe card.
Figure 5F:
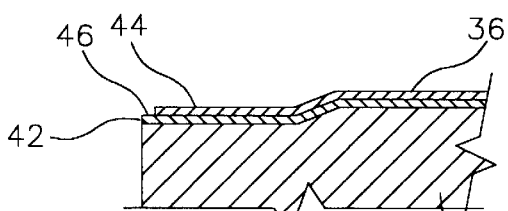
FIG. 5F is an enlarged cross sectional view taken along section line 5F—5F of FIG. 4 illustrating a bonding pad on the interconnect.
Figure 5C:
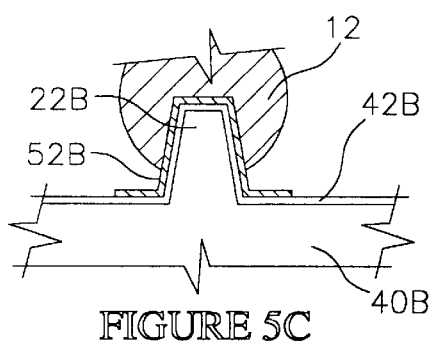
FIG. 5C is an enlarged cross sectional view taken along section line 5C—5C of FIG. 4 illustrating a bonding pad on the probe card.

Referring to FIG. 5B, an enlarged cross sectional view of a FET transistor 100 of the on board circuitry 38 is illustrated. As is apparent the FET transistor 100 is merely one component of the on board circuitry 38. The on board circuitry 38 can include many FET transistors 100, as well as additional components, to provide the circuit arrangements that will be hereinafter explained. Further, other active electrical switching devices, such as NPN or PNP transistors can be used in place of the FET transistor 100 illustrated in the preferred embodiment.

The FET transistors 100 can be formed integrally with the substrate 40 using semiconductor circuit fabrication techniques. A suitable process sequence can include initially etching the contacts 22 (FIG. 5A) and penetrating projections 50 (FIG. 5A) and then fabricating the FET transistors 100. Following formation of the FET transistors 100, the insulating layer 42 can be formed, the conductive layers 54 (FIG. 5A) can be formed, and the conductors 36 can be formed. Each FET transistor 100 includes a polysilicon gate 102, and a gate oxide 104. In addition, a field oxide 106 is formed on the substrate 40 for electrically isolating the FET transistors 100. The substrate 40 also includes N+ active areas 108, which can be formed by implanting dopants into the substrate 40 to form the sources and drains of the FET transistors 100. Metal filled vias 110 with metal silicide layers 112, electrically connect the sources and drains of the FET transistors 100 to the conductors 36. The FET transistors 100 also include spacers 114, TEOS layers 116 and nitride caps 118.

Figure 4A:
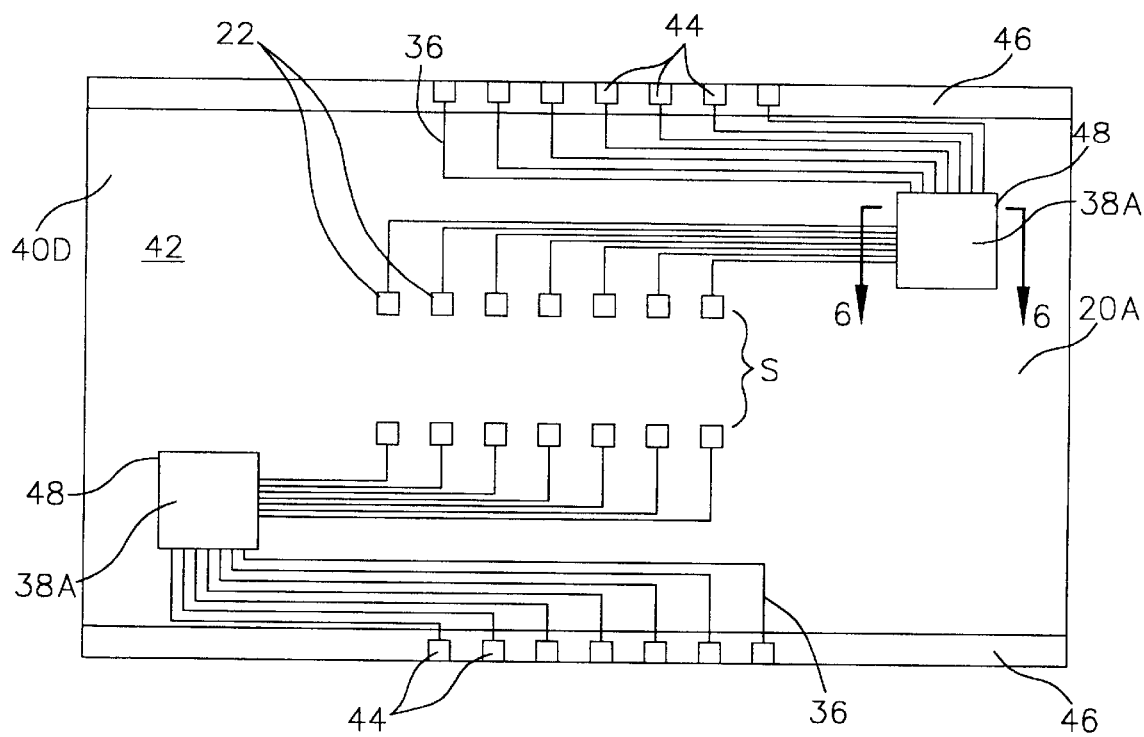
FIG. 4A is an enlarged plan view equivalent to FIG. 4 of an alternate embodiment probe card.

Referring to FIG. 4A, an alternate embodiment probe card 20A is illustrated. The probe card 20A is substantially similar to the probe card 20 previously described, but includes on board circuitry 38A formed on a surface of the substrate 40 rather than being formed integrally therewith. For example, the on board circuitry 38A can be included in a separate die mounted to the substrate 40, and then interconnected to the conductors 36. In this case the die containing the on board circuitry can be wire bonded or flip chip mounted to the substrate 40 in electrical communication with the contacts 14. In this embodiment the substrate 40 can comprise silicon, ceramic, or a glass filled resin (FR-4).

Figure 4B:
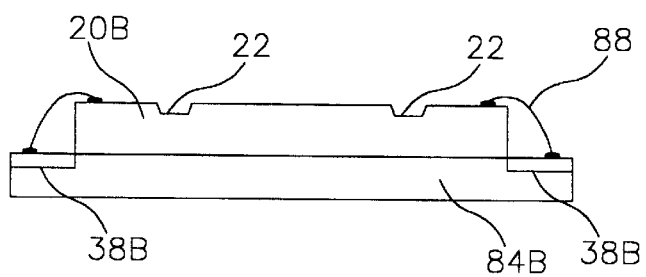
FIG. 4B is a schematic cross sectional view of another alternate embodiment probe card.
Figure 4C:
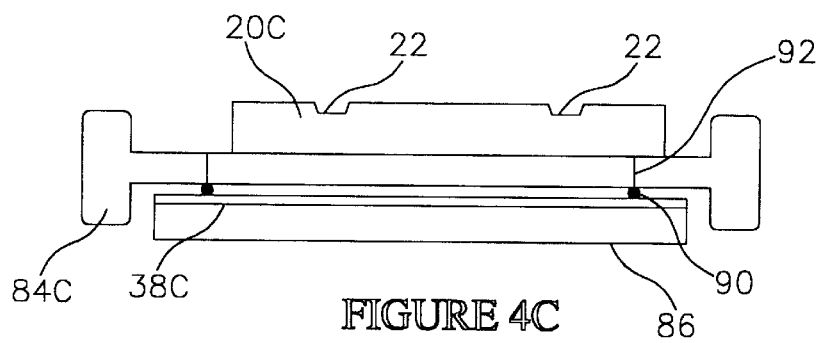
FIG. 4C is a schematic cross sectional view of another alternate embodiment probe card.

As another alternative, the on board circuitry can be included on an interposer attached to the probe card 20. Examples of interposers are shown in FIGS. 4B and 4C. In FIG. 4B, an interposer 84B includes on-board circuitry 38B, substantially as previously described. The interposer 84B can comprise a semiconducting material such as silicon, in which case the on-board circuitry 38B can be fabricated on the interposer 84B using semiconductor circuit fabrication techniques. Wire 88 can then be bonded to pads on the probe card 20 and to pads on the interposer 84A to provide separate electrical paths there between.

Alternately, as shown in FIG. 4C, on-board circuitry 38C can be contained on a die 86 attached to an interposer 84C (or directly to the probe card 20). In the embodiment of FIG. 4C, the die 86 is flip chip mounted to the interposer 84C. Reflowed solder bumps 90 on the die 86 are bonded to internal conductors 92 on the interposer 84C. In addition, the internal conductors 92 are in electrical communication with the contacts 22 on the probe card 20.

Figure 5D:
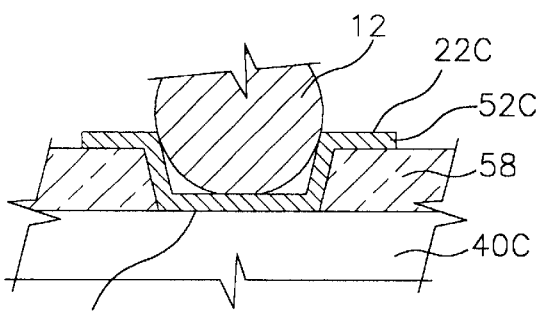
FIG. 5D is an enlarged cross sectional view taken along section line 5D—5D of FIG. 4A illustrating an alternate embodiment probe card contact electrically engaging a die contact on the wafer.

Referring to FIG. 5D, the probe card 20A can include contacts 22 MB which are attached to the substrate 40 rather than being formed integrally therewith. As shown in FIG. 5D, the probe card contacts 22 MB comprise metal microbumps formed on a polymer film 58 similar to multi layered TAB tape. In addition, conductors 36 MB are formed on an opposing side of the polymer film 58 in electrical communication with the contacts 22 MB. A compliant adhesive layer 60 attaches the polymer film 58 to a substrate 40 MB. Further details of contact 22 MB are described in U.S. Pat. No. 5,678,301, entitled "METHOD FOR FORMING AN INTERCONNECT FOR TESTING UNPACKAGED SEMICONDUCTOR DICE".

Another alternate embodiment probe card contact 22B is illustrated in FIG. 5E. Contacts 22B are configured to electrically engage die contacts 14B having solder bumps 56 formed thereon. The contacts 22B permit a bumped die 12B to be tested. The contacts 22B comprise indentations formed in a substrate 40B. In this embodiment the substrate can comprise silicon, gallium arsenide, ceramic or other substrate material. The indentations can be etched or machined to a required size and shape and then covered with conductive layers 54B. The contacts 22B are configured to retain the solder bumps 56. In addition, the conductive layers 54B for the contacts 22B are in electrical communication with conductors equivalent to the conductors 36 previously described. Further details of contact 22B are described in U.S. patent application Ser. No. 08/829,193, entitled "INTERCONNECT HAVING RECESSED CONTACT MEMBERS WITH PENETRATING BLADES FOR TESTING SEMICONDUCTOR DICE AND PACKAGES WITH CONTACT BUMPS", incorporated herein by reference.

Referring to FIG. 6, further details of the test system 16 and probe card 20 are illustrated. The wafer prober 18 includes the probe card holder 62, a force applying fixture 64 and a force applying mechanism 66. These items can be components of a conventional wafer prober as previously described. The force applying mechanism 66 presses against a pressure plate 68 and a compressible member 70 to bias the probe card 20 against the wafer 10. By way of example, the compressible member 70 can be formed of an elastomeric material such as silicone, butyl rubber, or fluorosilicone; in foam, gel, solid or molded configurations.

In addition, a flexible membrane 72 is bonded to the probe card 20 and to the probe card holder 62. In general, the flexible membrane 72 functions to physically attach the probe card 20 to the probe card holder 62. In addition, the flexible membrane 72 functions to provide electrical paths between the contacts 22 and the test circuitry 33 (FIG. 3) of the tester 26. The flexible membrane 72 can be formed of thin flexible materials to allow movement of the probe card 20 in Z-directions. For example, the flexible membrane 72 can be formed of a flexible multi layered material similar to TAB tape.

In the illustrative embodiment, the flexible membrane 72 comprises a layer of polymer tape having metal conductors thereon. Bonded connections are formed between the conductors on the membrane 72 and corresponding conductors 74 on the probe card holder 62. In addition, bonded connections are formed between the conductors on the membrane 72 and the bonding pads 44 on the probe card 20.

Still referring to FIG. 6, the wafer prober 18 includes spring loaded electrical connectors 76 which are in electrical communication with the prober interface board 28. One type of spring loaded electrical connector 76 is manufactured by Pogo Industries of Kansas City, Mo. under the trademark "POGO PINS". The electrical connectors 76 electrically communicate with internal conductors 78 on the probe card holder 62.

The probe card mounting arrangement shown in FIG. 6, as well as others, are described in U.S. patent application Ser. No. 08/797,719, entitled "PROBE CARD FOR SEMICONDUCTOR WAFERS AND METHOD AND SYSTEM FOR TESTING WAFERS", incorporated herein by reference. However, it is to be understood that these mounting arrangements are merely exemplary and the probe card 20 can be mounted in a conventional manner on a commercially available wafer prober.

TEST METHOD

Referring to FIG. 7, steps in a method for testing the wafer 10 using the test system 18 and probe card 20 are illustrated. These steps are as follows.

1. Place contacts 22 on probe card 20 in electrical communication with die contacts 14 on dice 12 (devices under test).

2. Test the dice 12 in groups for opens and shorts by selectively actuating contacts 22 on the probe card 20 up to limit of tester resources.

3. Disable defective dice 12 by selectively actuating contacts 22 on the probe card 20.

4. Write test signals from tester 26 to multiple dice 12 by multiplexing input test signals to selected contacts 22 and die contacts 14 on multiple dice 12 at the same time.

5. Read test signals from multiple dice 12 in groups up to limit of tester resources, while maintaining device uniqueness and ability to disconnect defective dice 12.

Multiplex Circuit

Figure 8A:
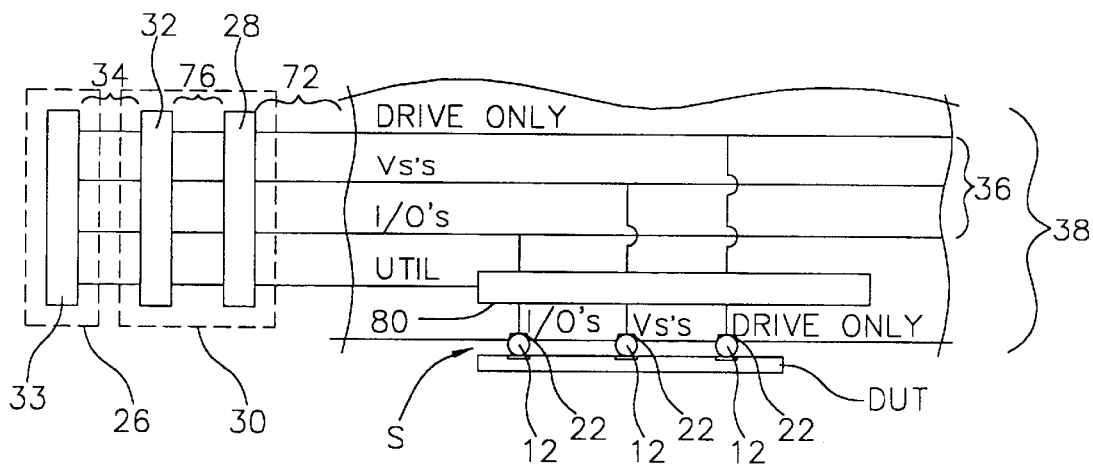
FIG. 8A is a schematic electrical diagram of on board circuitry and a test site contained on the probe card and the electrical interface of the probe card and tester.

Referring to FIGS. 8A–8D, further details of the on board circuitry 38 (FIG. 4A) are illustrated. In FIG. 8A a single test site S is illustrated. The test site S on the probe card 20 includes a pattern of contacts 22 which are configured to electrically engage die contacts 14 on a device under test DUT. As previously described, the probe card 20 is in electrical communication with the probe card holder 62, the tester pin electronics 32, and the test circuitry 33 within the tester 26.

As shown in FIG. 8A, the on board circuitry 38 includes a multiplex circuit 80. The multiplex circuit 80 is configured to receive test signals from the test circuitry 33 and to fan out or multiply the test signals. In addition, the multiplex circuit 80 is configured to selectively address the fanned out test signals through the probe card contacts 22 to selected die contacts 14 on the DUT. Stated differently, the multiplex circuit permits the test signals to be fanned out, allowing test procedures to be conducted in parallel. At the same time, the multiplex circuit 80 is configured to maintain the uniqueness of individual DUTs, and to electrically disconnect defective DUTs as required.

As shown in FIG. 8A, the multiplex circuit 80 includes a Util channel for each DUT, which functions as a control channel. In addition to the Util channel, the multiplex circuit 80 includes drive only channels, Vs channels, and I/O channels. The numbers of the channels are determined by the tester resources. Table I lists the tester resources of a model "J993" tester 26 manufactured by Teradyne.

TABLE I

Tester Resources of Teradyne "J993" Tester 16 power supply channels per test head (30)
16X, 16Y address generation channels per test head (30)
16 DUTs can be tested in parallel per test head (30)
72 I/O channels per test head (30)
2 heads (30) per tester (26)
320 drive only channels per head (30) divisible as follows:
80 per test site (S) with 4 test sites (S0–S3)
40 per test site (S) with 8 test sites (S0–S7)
20 per test site (S) with 16 test sites (S0–S15)
Up to 320 megabits of catch RAM
36 Util channels per test head (30)

Table II lists the tester resources of a model "J994" tester 26 manufactured by Teradyne.

TABLE II

Tester Resources of Teradyne "J994" Tester 32 power supply channels per test head (30)
16X, 16Y address generation channels per test head (30)
32 DUTs can be tested in parallel per test head (30)
144 I/O channels per test head (30)

TABLE II-continued

Tester Resources of Teradyne "J994" Tester 2 heads (30) per tester (26)
640 drive only channels per head 30 divisible as follows:
80 per test site (S) with 8 test sites (S1–S8)
40 per test site (S) with 16 test sites (S1–S16)
20 per test site (S) with 32 test sites (S1–S32)
Up to 640 megabits of catch RAM
52 Util channels per test head (30)

Table III lists the test requirements for one type of SRAM.

TABLE III

Sample SRAM Requirements For Each Device Under Test DUT

36 I/O channels per DUT
18 address channels (drive only) per DUT
32 control channels (drive only) per DUT
6 power supply channels (Vs-voltage supplies) per DUT
Util channels used depends on parallelism
Total
36 I/O channels per DUT
50 drive only channels per DUT
6 Vs channels per DUT With these sample requirements a "J993" tester 26 can test two DUTs per test head 30, due to the I/O requirements. This is shown schematically in FIG. 8C. In FIG. 8C, the (J993) tester 26 includes a first test head 30-0 and a second test head 30-1. Each test head 30-0, 30-1, is capable of testing two DUTs, for a total of four at a time. Following testing of these four DUTs, both wafers 10 (one on each test head) can be stepped such that four additional DUTs align with the probe card contacts for testing.

A "J994" tester 26 has twice the tester resources of a "J993" tester 26. Accordingly on the basis of the above sample I/O requirements, a "J994" tester 26 can test four DUTs per test head 30, for a total of eight at a time.

Figure 8B:
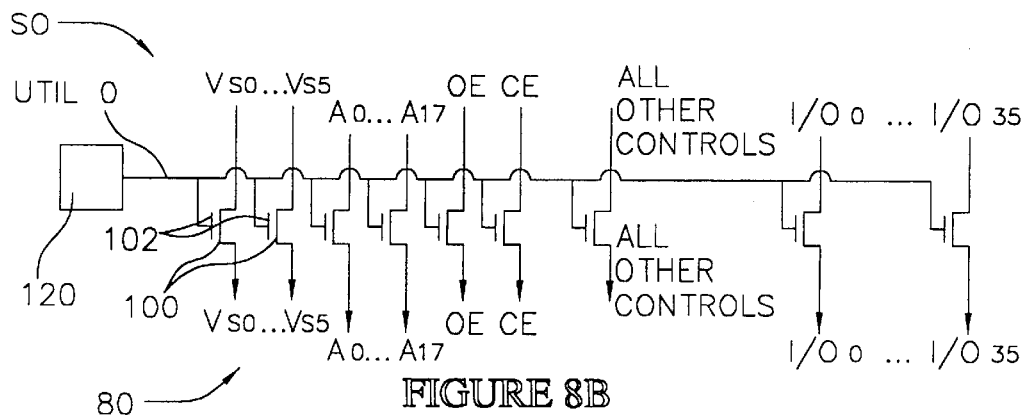
FIG. 8B is a schematic electrical diagram of a multiplex circuit of the on board circuitry.
Figure 8C:
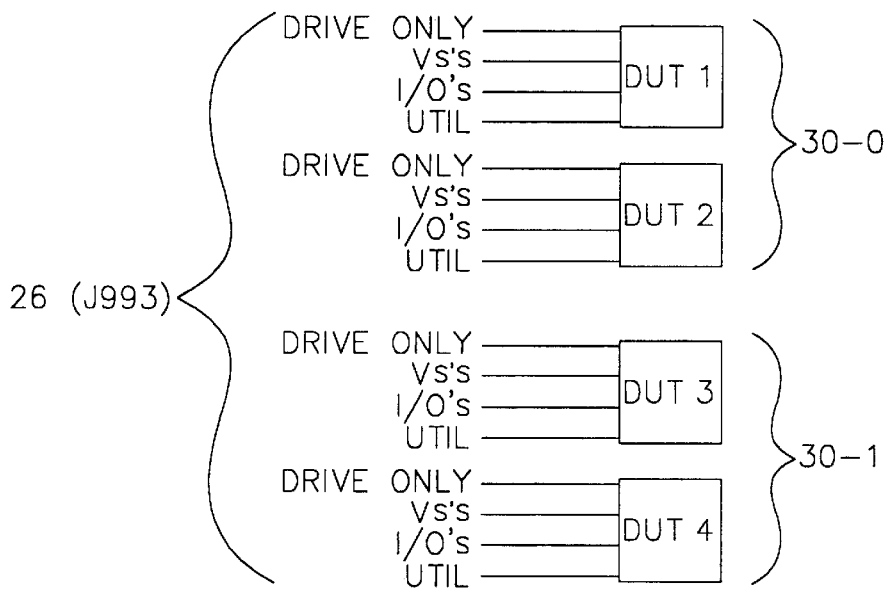
FIG. 8C is a schematic electrical diagram illustrating a test operation for a tester with a prior art probe card.

Referring to FIG. 8B, a single test site S of the multiplex circuit 80 is illustrated. The multiplex circuit 80, simply stated, comprises multiple FET transistors 100 configured to provide a switching circuit for selectively enabling and disabling the contacts 22 on the probe card 20. The gate 102 of each FET transistor 100 is in electrical communication with the Util 0 channel. A controller 120 (or computer) generates control signals which are transmitted through the Util 0 channel to the FET transistors 100.

In the illustrative embodiment the multiplex circuit 80 is configured to test the SRAM of Table III. Accordingly, there are six Vs channels (Vs0 ... Vs5), eighteen address channels (A0 ... A17), and thirty six I/O channels (I/O0–I/O35). In addition, there is an OE channel, a CE channel, and an "all other controls" channel. With this arrangement test signals can be transmitted from the test circuitry 33 and latched by the channels. Control signals from the controller 120 then control the FET transistors 100 to enable and disable the contacts 22 to selectively transmit the test signals to the die contacts 14 as required.

During the test mode the uniqueness of each DUT is maintained. In addition, the control signals can be used to operate the FET transistors 100 to disable selected contacts 22 in order to electrically disconnect defective DUTs. Still further, the control signals can be used to operate the FET transistors 100 to enable and disable selected contacts 22 in the transmission of "read" signals from the DUTs. However, in the "read" mode the DUTs must be read in accordance with the tester resources.

As is apparent, the multiplex circuit 80 illustrated in FIG. 8B is merely exemplary. Those skilled in the art, with the aid of the present specification, can design other multiplex circuits able to multiply and selectively address test signals from a tester. Thus other types of multiplexing circuits are intended to be included within the scope of the present claims.

Figure 8D:
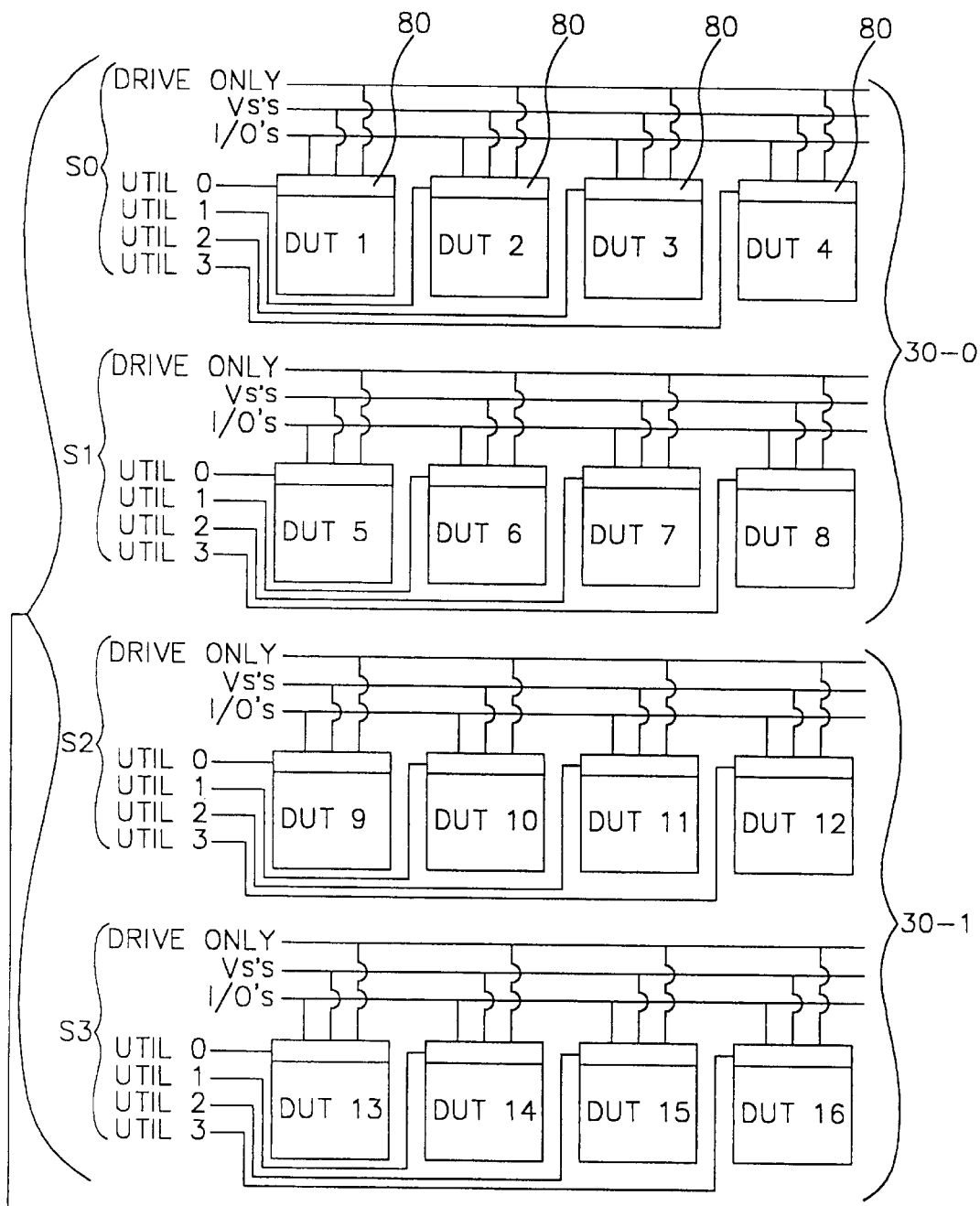
FIG. 8D is a schematic electrical diagram illustrating a test operation for the tester of FIG. 8C but with a probe card and multiplex circuit constructed in accordance with the invention.

Referring to FIG. 8D, the operation of the J993 tester 26 of Table I, outfitted with the probe card 20 having the multiplex circuit 80 is illustrated. In this example there are four test sites S0, S1, S2, S4 contained in two test heads 30-0, 30-1. Using the multiplex circuit each test site can write test signals to four DUTs at a time. In the "read" mode the additional three DUTs per test site must be selected in accordance with tester resources (e.g., one at a time or two at a time).

A limiting factor in the number of DUTs that can be tested by each test site is the drive current capacity of the channels of the tester 26. On the J993 and J994 testers 26, the drive current capacity is about 50 mA per channel. In addition, the test signals can be specified with a current (IOL) of about 8 mA per channel. Thus with some margin, each I/O channel and drive only channel of the tester 26 can be configured to drive four DUTs substantially as shown in FIG. 8D. During a write operation there is 8 mA per DUT X 4 DUTs=32 mA per tester drive only channel. This leaves a 18 mA per channel margin.

Thus the invention provides an improved probe card for testing semiconductors wafers, a method for testing semiconductor wafers using the probe card, and a test system employing the probe card. The probe card can include contacts in dense arrays to accommodate testing of multiple dice having dense arrays of die contacts. In addition, the probe card includes on board circuitry configured to expand tester resources.

While the invention has been described with reference to certain preferred embodiments, as will be apparent to those skilled in the art, certain changes and modifications can be made without departing from the scope of the invention as defined by the following claims.

What is claimed is:

1. An interconnect for testing semiconductor components contained on a component substrate and having bumped component contacts comprising:
    an interconnect substrate;
    a plurality of interconnect contacts on the interconnect substrate configured to make temporary electrical connections with the bumped component contacts, the interconnect contacts arranged in sets configured to electrically engage selected components on the component substrate; and
    a multiplex circuit comprising a plurality of active electrical switching devices on the interconnect substrate in electrical communication with the interconnect contacts, the circuit configured to fan out test signals from a tester to the interconnect contacts to expand tester resources, to control the interconnect contacts to selectively transmit the test signals to the bumped component contacts while the sets maintain a uniqueness of each component on the component substrate, and to disconnect a defective component on the component substrate from the tester.

2. The interconnect of claim 1 wherein the interconnect contacts comprise conductive pockets in the interconnect substrate.

3. The interconnect of claim 1 wherein the interconnect contacts comprise pockets in the interconnect substrate and blades in the pockets at least partially covered with conductive layers and configured to penetrate the bumped component contacts.

4. The interconnect of claim 1 wherein the interconnect contacts comprise projections on the interconnect substrate at least partially covered with conductive layers and configured to penetrate the bumped component contacts.

5. The interconnect of claim 1 wherein the interconnect contacts comprise an elastomeric layer on the interconnect substrate and pockets in the elastomeric layer at least partially covered with conductive layers.

6. The interconnect of claim 1 wherein the components comprise bumped dice and the component substrate comprises a wafer or portion thereof.

7. The interconnect of claim 1 wherein the components comprise chip scale packages and the component substrate comprises a wafer or a panel of a material.

8. An interconnect for testing a semiconductor component having bumped component contacts comprising:
   a substrate comprising a semiconductor material;
   a plurality of interconnect contacts comprising pockets in the substrate configured to retain the bumped component contacts and conductive layers on the pockets configured to make temporary electrical connections with the bumped component contacts; and
   a multiplex circuit comprising a plurality of active semiconductor devices in the substrate in electrical communication with the interconnect contacts, and configured to fan out test signals from a tester, the multiplex circuit operable in response to control signals to selectively enable and disable the interconnect contacts to permit selective transmission of the test signals to the bumped component contacts, and to selectively disconnect the component from the tester.

9. The interconnect of claim 8 wherein each conductive layer comprises a peripheral edge configured to penetrate a bumped component contact.

10. The interconnect of claim 8 wherein the interconnect contacts comprise a plurality of blades in the pockets configured to penetrate the bumped component contacts.

11. The interconnect of claim 8 wherein the substrate comprises an elastomeric layer, the pockets are in the elastomeric layer, and the conductive layers are on the elastomeric layer.

12. An interconnect for testing a semiconductor component having bumped component contacts comprising:
   a substrate;
   a plurality of first interconnect contacts on the substrate configured to make temporary electrical connections with the bumped component contacts;
   a semiconductor die on the substrate comprising a plurality of bumped bond pads and a multiplex circuit in electrical communication with the bumped bond pads configured to fan out test signals from a tester; and
   a plurality of second interconnect contacts on the substrate in electrical communication with the first interconnect contacts, the second interconnect contacts comprising a plurality of conductive pockets in the substrate configured to retain and electrically engage the bumped bond pads on the die.

13. The interconnect of claim 12 wherein the bumped bond pads on the die are bonded to the second interconnect contacts on the substrate.

14. An interconnect for testing semiconductor components contained on a component substrate and having a plurality of bumped contacts comprising:
   an interconnect substrate comprising a first set of conductive pockets configured to make temporary electrical connections with the bumped contacts on the components, and a second set of conductive pockets in electrical communication with the first set of conductive pockets;
   a bumped semiconductor die flip chip mounted to the interconnect substrate in electrical communication with the second set of conductive pockets; and
   a multiplex circuit on the die in electrical communication with the second set of conductive pockets, the circuit configured to fan out test signals from a tester, to control the first set of conductive pockets to selectively transmit the test signals to the bumped contacts, and to disconnect a defective component on the component substrate from the tester.

15. The interconnect of claim 14 wherein the components comprise bumped dice and the component substrate comprises a wafer or a portion thereof.

16. The interconnect of claim 14 wherein the components comprise packages and the component substrate comprises a wafer or a panel.

17. In a test system including a tester having a test circuit for generating test signals and a plurality of electrical paths in electrical communication with the test circuit, the tester having tester resources determined by a signal generating and analyzing capability and by a number of the electrical paths, an interconnect for applying the test signals to semiconductor components contained on a component substrate and having bumped contacts, comprising:
   a semiconductor substrate comprising a plurality of interconnect contacts arranged in test sites configured to make temporary electrical connections with the bumped contacts on the components; and
   a multiplex circuit comprising a plurality of active semiconductor devices in the semiconductor substrate in electrical communication with the tester and with the interconnect contacts, the multiplex circuit configured to expand the tester resources by fanning out at least some of the test signals to the interconnect contacts while the test sites maintain a uniqueness of each component on the component substrate, and to electrically disconnect a defective component on the component substrate.

18. The interconnect of claim 17 wherein the test signals include a plurality of write signals and the multiplex circuit is configured to fan out and transmit the write signals to a plurality of components on the component substrate.

19. The interconnect of claim 17 wherein the interconnect contacts comprise conductive projections on the semiconductor substrate configured to penetrate the bumped contacts.

20. The interconnect of claim 17 wherein the interconnect contacts comprise conductive pockets in the semiconductor substrate configured to retain and electrically engage the bumped contacts.

* * * * *